(12) United States Patent
Inada et al.

(10) Patent No.: US 8,524,609 B2
(45) Date of Patent: Sep. 3, 2013

(54) METHOD OF FABRICATING SEMICONDUCTOR DEVICE

(75) Inventors: Satoshi Inada, Kanagawa-ken (JP); Mitsuhiro Omura, Kanagawa-ken (JP); Hisataka Hayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 13/230,118

(22) Filed: Sep. 12, 2011

(65) Prior Publication Data

US 2012/0214308 A1 Aug. 23, 2012

(30) Foreign Application Priority Data

Feb. 23, 2011 (JP) ................................. P2011-037603

(51) Int. Cl.
*H01L 21/302* (2006.01)
(52) U.S. Cl.
USPC ........... 438/725; 438/712; 438/717; 438/736; 216/47
(58) Field of Classification Search
USPC ................. 438/708, 709, 717, 725, 736, 706, 438/712; 216/41, 47; 430/313, 314
See application file for complete search history.

(56) References Cited

U.S. PATENT DOCUMENTS

| 7,235,474 | B1 * | 6/2007 | Dakshina-Murthy et al. .......................... 438/597 |
| 2005/0003300 | A1 * | 1/2005 | Kobayashi ................. 430/270.1 |
| 2006/0275692 | A1 * | 12/2006 | Okawa et al. ................. 430/269 |
| 2009/0029284 | A1 * | 1/2009 | Matsumaru et al. ........ 430/270.1 |
| 2010/0167502 | A1 * | 7/2010 | Yen et al. ....................... 438/478 |
| 2011/0251323 | A1 * | 10/2011 | Yoshimura et al. ........... 524/317 |

FOREIGN PATENT DOCUMENTS

WO WO 01/79933 A1 10/2001

* cited by examiner

*Primary Examiner* — Lan Vinh
(74) *Attorney, Agent, or Firm* — Finnegan, Henderson, Farabow, Garrett & Dunner, L.L.P.

(57) ABSTRACT

An aspect of the present embodiment, there is provided a method of fabricating a semiconductor device including providing a film to be processed above a semiconductor substrate, providing a negative-type resist and a photo-curable resist in order, pressing a main surface of a template onto the photo-curable resist, the main surface of the template having a concavo-convex pattern with a light shield portion provided on at least a part of a convex portion, irradiating the template with light from a back surface of the template, developing the negative-type resist and the photo-curable resist so as to print the concavo-convex pattern of the template on the negative-type resist and the photo-curable resist, and etching the film to be processed by using the concavo-convex pattern printed on the negative-type resist and the photo-curable resist as a mask.

16 Claims, 2 Drawing Sheets

METHOD OF FABRICATING SEMICONDUCTOR DEVICE

CROSS REFERENCE TO RELATED APPLICATION

This application is based upon and claims the benefit of priority from prior Japanese Patent Application No. 2011-037603, filed on Feb. 23, 2011, the entire contents of which are incorporated herein by reference.

FIELD

Exemplary embodiments described herein generally relate to a method of fabricating a semiconductor device.

BACKGROUND

Recently, imprint technology, especially nano-imprint technology has been developed in stead of photo-lithography technology. In imprint technology, fine concavo-convex pattern provided on a template is pressed on a photo-curable resist layer. Successively, the photo-curable resist layer is irradiated with UV light to be hardened, so that the fine concavo-convex pattern is printed on the photo-curable resist layer.

In nano-imprint technology, the concavo-convex pattern of the template is printed on the photo-curable resist. In the processing step, a residual film of the photo-curable resist is leaved. Accordingly, the residual film is necessary to be removed for etching back the film to be processed. In the etching step, the photo-curable resist can be etched. Therefore, it is difficult that a thickness of the resist is retained for etching the film to be processed.

The resist used in conventional nano-imprint technology has a good property of demolding as compared to a conventional photo-resist, however, has lower etching resistance.

Consequently, it is difficult to controllably etch the film to be processed by using the concavo-convex pattern of the resist as a mask.

As described above, it is necessary to provide a method for fabricating a semiconductor device which can controllably etch the film to be processed.

DETAILED DESCRIPTION

Figure 1A:
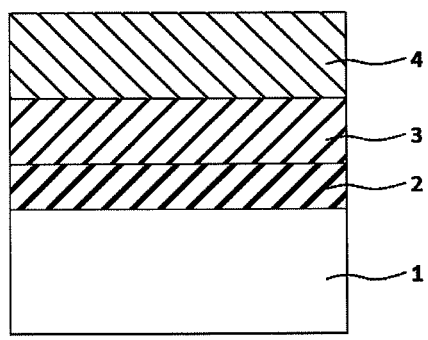
FIGS. 1A-1F are cross-sectional views showing a method of fabricating a semiconductor device according to a first embodiment.

An aspect of the present embodiment, there is provided a method of fabricating a semiconductor device including providing a film to be processed above a semiconductor substrate, providing a negative-type resist on the film to be processed, providing a photo-curable resist on the negative-type resist, pressing a main surface of a template onto the photo-curable resist, the main surface of the template having a concavo-convex pattern with a light shield portion provided on at least a part of a convex portion in the concavo-convex pattern, irradiating the template with light from a back surface of the template, developing the negative-type resist and the photo-curable resist which are not irradiated with light so as to print the concavo-convex pattern of the template on the negative-type resist and the photo-curable resist, and etching the film to be processed by using the concavo-convex pattern printed on the negative-type resist and the photo-curable resist as a mask.

Embodiments will be described below in detail with reference to the attached drawings mentioned above. Throughout the attached drawings, similar or same reference numerals show similar, equivalent or same components.

First Embodiment

A method of fabricating a semiconductor device according to a first embodiment will be described below.

FIG. 1 is a cross-sectional view showing a method of fabricating a semiconductor device according to a first embodiment.

As shown in FIG. 1A, a film to be processed 2 is provided above a semiconductor substrate 1. The film to be processed 2 is an amorphous silicon film, for example, which is formed by CVD (Chemical Vapor Deposition).

A negative-type resist 3 is spin-coated on the film to be processed 2, and then is pre-baked. The negative-type resist 3 is provided for improving etching resistance of a mask when the film to be processed 2 is etched. A resist with higher viscosity than a photo-curable resist 4 is used as the negative-type resist 3 mentioned after. The viscosity of the negative-type resist 3 is 10-50 mPa·s, for example. In the processing step, a thickness of the negative-type resist 3 is nearly 100 nm, for example. Polystyrene-series resin including benzene ring is used as the negative-type resist 3, for example. Such the negative-type resist 3 including the benzene ring has higher etching resistance than acrylic-series resin used as the photo-curable resist 4 mentioned after.

The photo-curable resist 4 is coated on the negative-type resist 3 by ink-jet technique. The resist with lower viscosity than the negative-type resist 3 is used as the photo-curable resist 4. In such a manner, the photo-curable resist 4 is precisely controlled to be outlet by ink-jet technique. As mentioned after, the resist are precisely filled into a groove of a pattern when a template 5 is adhered to be pressed on the photo-curable resist 4. Acrylic-series resin is used as the photo-curable resist 4. The viscosity of the photo-curable resist 4 is 8-10 mPa·s, for example. In the processing step, a thickness of the photo-curable resist 4 is nearly 60 nm. The photo-curable resist 4 is one kind of negative-type resists, and has a property hardened by photo-irradiation.

Figure 1B:
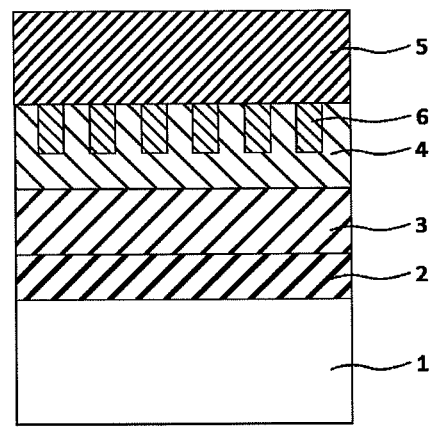

As shown in FIG. 1B, a main surface of the template 5 with a concavo-convex pattern is adhered to be pressed on the photo-curable resist 4. In such a manner, the photo-curable resist 4 is filled in the concave portion of the concavo-convex pattern in the template 5 with capillarity. An Al film, for example, as light shield portions 6 with non-transparency is provided on portions of the concavo-convex pattern in the template 5. In such a manner, the negative-type resist 3 and the photo-curable resist 4 can be selectively irradiated with light as mentioned after. Each of the light shield portions 6 is provided on each of the convex portions of the concavo-convex pattern in the template 5. The light shield portion 6 can be provided on each of a portion other than the all convex portions. Therefore, the light shield portion 6 can be provided on a leading edge of the convex portion, and the convex portion other than the leading edge can be integrated as a main body of the template 5. A material of the light shield portion 6 is a metal film, a semi-metal film, a metal oxide film, a metal nitride film, a metal-alloy film or the like, for example, which includes at least one selected from Al, Ni, Co, Cr, Ti, Ta, W, Mo, Sn, Zn semi-metal Si. The main body of the template 5A is composed of transmissive material to UV light below 400 nm of wavelength. A quartz glass, a heat resistance glass, calcium fluoride, magnesium fluoride or an acrylic glass or a stacked structure using the materials mentioned above is used as the transmissive material.

The template 5 is irradiated with light from a back surface of the template 5. As the light shield portion 6 is provided on a portion of the template 5, light is not transmissive at the portion with the light shield portion 6 and is transmissive at the portion without the light shield portion 6. Accordingly, each of the photo-curable resist 4 and the negative-type resist 3 without the light shield portion 6 are photo-irradiated. Light with good transparency on the main body of the template 5 is used as the irradiated light, for example, an UV light with i-line wavelength.

Figure 1C:
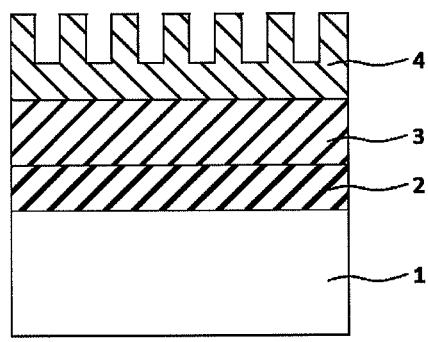

After the negative-type resist 3 and the photo-curable resist 4 are post-baked, the template 5 is demolded from the photo-curable resist 4. As shown in FIG. 1C, the concavo-convex pattern of the template 5 is printed on an upper portion of the photo-curable resist 4.

The negative-type resist 3 and the photo-curable resist 4 without photo-irradiation are developed. Organic solvent or alkali solvent, for example, develops the resist. In such a manner, the photo-irradiated pattern is developed as a mask pattern to process the film to be processed 2.

Figure 1D:
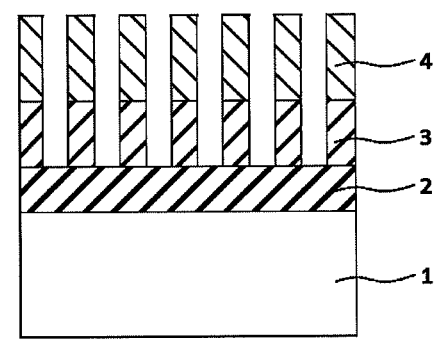
Figure 1E:
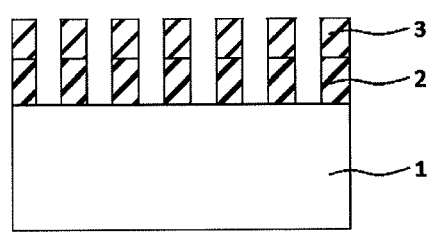
Figure 1F:
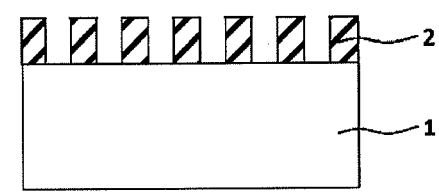

As shown in FIG. 1D, the concavo-convex pattern of the template 5 is printed on the negative-type resist 3 and the photo-curable resist 4, and a mask with two-layer structure is provided. In this mask, the lower layer is the negative-type resist 3 and the upper layer is the photo-curable resist 4. When selective photo-irradiation and development are performed by using a conventional photo-curable resist with mono-layer structure, an aspect ratio becomes larger as a thickness of the photo-curable resist being thicker. Consequently, the pattern is deformed due to residual stress in the resist. In this embodiment, the mask with the two layer structure including the negative-type resist 3 with higher etching resistance than the photo-curable resist 4 is used as the lower layer. As a thickness of each layer is decreased, the aspect ratio of the two-layer can be decreased to suppress the pattern deformation, so that the mask having higher etching resistance can be provided. The film to be processed 2 can be controllably etched by using the mask mentioned above. Further, the photo-curable resist 4 with good demolding property is used as the upper layer. Accordingly, imprint characteristics as the same as a conventional method, filling resist or demolding a template, for example, can be realized.

Second Embodiment

A method of fabricating a semiconductor device according to a second embodiment will be described below.

FIG. 2 is a cross-sectional view showing a method of fabricating the semiconductor device according to the second embodiment.

The second embodiment is differ from the first embodiment in that a positive-type resist 7 is used instead of the negative-type resist 3 as an underlying layer in a mask with two-layer structure.

Figure 2A:
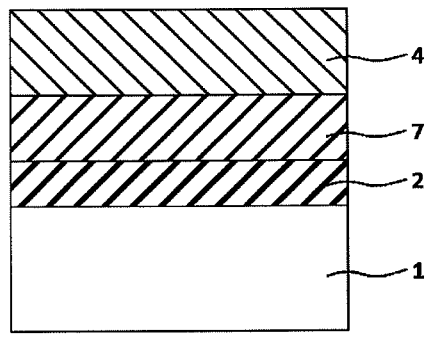
FIG. 2A-2E are cross-sectional views showing a method of fabricating a semiconductor device according to a second embodiment.

As shown in FIG. 2A, as the same as the first embodiment, the film to be processed 2 is provided on the semiconductor substrate 1. A positive-type resist 7 is spin-coated above the film to be processed 2, and then is pre-baked. The positive-type resist 7 is provided for improving etching resistance of a mask when the film to be processed 2 is etched. A resist with higher viscosity than the photo-curable resist 4 mentioned after is used as the positive-type resist 7. The viscosity of the positive-type resist 7 is 10-50 mPa·s, for example. Novolak-series resin including benzene ring is used as the positive-type resist 7, for example. Such novolak-series resin has higher etching resistance than acrylic-series resin used as the photo-curable resist 4 as mentioned after.

The photo-curable resist 4 is coated on the positive-type resist 7 by ink-jet technique. As mentioned above, the resist with lower viscosity than the positive-type resist 7 is used as the photo-curable resist 4 to obtain good imprint characteristics such as ink-jet property or filling property.

Figure 2B:
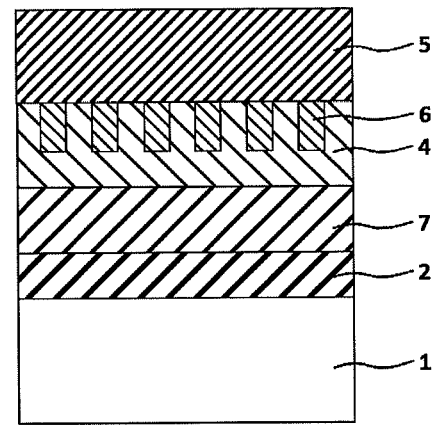

As shown in FIG. 2B, a main surface of the template 5 with a concavo-convex pattern is adhered to be pressed on the photo-curable resist 4. The light shield portions 6 with non-transmissive are provided on portions of the concavo-convex pattern in the template 5.

The template 5 is irradiated with light from a back surface of the template 5. Light is not transmissive at the portion with the light shield portion 6 and is transmissive at the portion without the light shield portion 6.

Figure 2C:
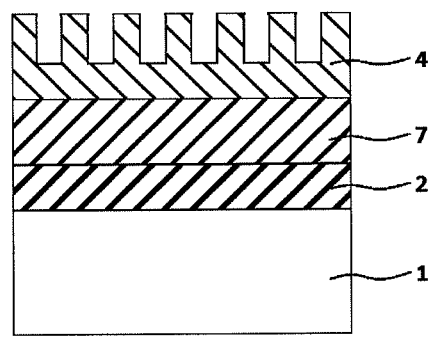

After the positive-type resist 7 and the photo-curable resist 4 are post-baked, the template 5 is demolded from the photo-curable resist 4. As shown in FIG. 2C, the concavo-convex pattern of the template 5 is printed on an upper portion of the photo-curable resist 4.

The photo-irradiated positive-type resist 7 is developed. In such a manner, the photo-curable resist 4 on the developed positive-type resist 7 is lifted off to be removed. Organic solvent or alkali-series solvent, for example, develops the resist. In such a manner, portions of the positive-type resist 7 which are not photo-irradiated, is remained, so that a mask pattern of the positive-type resist 7 which has higher etching resistance than the photo-curable resist 4 is provided.

Figure 2D:
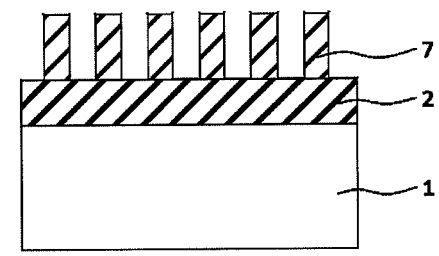
Figure 2E:
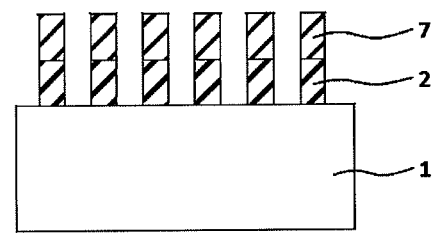

As shown in FIG. 2D, the film to be processed 2 is etched using the positive-type resist 7 as a mask. After that, the positive-type resist 7 is removed as shown in FIG. 2E.

As mentioned above, a mask with a two-layer structure is used in the second embodiment. In this mask, the positive-type resist 7 with higher etching resistance than the photo-curable resist 4 is provided as the lower layer. In such a manner, as a thickness of each layer is decreased, the aspect ratio of the two-layer can be decreased to suppress the pattern deformation, so that the mask having higher etching resistance can be provided. The film to be processed 2 can be controllably etched by using the mask mentioned above. Further, the photo-curable resist 4 with good demolding property is used as the upper layer. Accordingly, imprint characteristics as the same as a conventional method, filling resistor demolding a template, for example, can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:

providing a film to be processed above a semiconductor substrate;

providing a negative-type resist on the film to be processed;

providing a photo-curable resist on the negative-type resist;

pressing a main surface of a template onto the photo-curable resist, the main surface of the template having a concavo-convex pattern with a light shield portion provided on a part of a convex portion in the concavo-convex pattern so as to be transmissive at the concave portion;

irradiating the template with light from a back surface of the template;

developing the negative-type resist and the photo-curable resist which are not irradiated with light so as to print the concavo-convex pattern of the template on the negative-type resist and the photo-curable resist; and etching the film to be processed by using the concavo-convex pattern printed on the negative-type resist and the photo-curable resist as a mask.

2. The method of claim 1, wherein
the negative-type resist has larger viscosity than the photo-curable resist.

3. The method of claim 2, wherein
viscosities of the negative-type resist and the photo-curable resist are 10-50 mPa·s and 8-10 mPa·s, respectively.

4. The method of claim 1, wherein
the photo-curable resist has better demolding characteristics than the negative-type resist.

5. The method of claim 1, wherein
the negative-type resist is composed of polystyrene-series resin.

6. The method of claim 1, wherein
the photo-curable resist is composed of acrylic-series resin.

7. The method of claim 1, wherein
the light shield portion is composed of a metal film, a semi-metal film, a metal oxide film, a metal nitride film or a metal-alloy film in which at least one selected from Al, Ni, Co, Cr, Ti, Ta, W, Mo, Sn, Zn or semi-metal Si is included.

8. The method of claim 1, wherein
the light shield portion is provided on a leading edge of the convex portion.

9. A method of fabricating a semiconductor device, comprising:

providing a film to be processed above a semiconductor substrate;

providing a positive-type resist on the film to be processed;

providing a photo-curable resist on the positive-type resist, the photo-curable resist having smaller viscosity than the positive-type resist;

pressing a main surface of a template onto the photo-curable resist, the main surface of the template having a concavo-convex pattern with a light shield portion provided on a part of a convex portion in the concavo-convex pattern so as to be transmissive at the concave portion;

irradiating the template with light from a back surface of the template;

developing the photo-curable resist which is not irradiated with light and the positive-type resist which is irradiated with light, and lifting off the photo-curable resist on the positive-type resist so as to print the concavo-convex pattern of the template on the positive-type resist; and etching the film to be processed by using the concavo-convex pattern printed on the positive-type resist as a mask.

10. The method of claim 9, wherein
the positive-type resist has larger viscosity than the photo-curable resist.

11. The method of claim 10, wherein
viscosities of the positive-type resist and the photo-curable resist are 10-50 mPa·s and 8-10 mPa·s, respectively.

12. The method of claim 9, wherein
the photo-curable resist has better demolding characteristics than the positive-type resist.

13. The method of claim 9, wherein
the positive-type resist is composed of novolak-series resin.

14. The method of claim 9, wherein
the photo-curable resist is composed of acrylic-series resin.

15. The method of claim 9, wherein
the light shield portion is composed of a metal film, a semi-metal film, a metal oxide film, a metal nitride film or a metal-alloy film in which at least one selected from Al, Ni, Co, Cr, Ti, Ta, W, Mo, Sn, Zn or semi-metal Si is included.

16. The method of claim 9, wherein
the light shield portion is provided on a leading edge of the convex portion.

* * * * *